US012610669B2

(12) United States Patent
Zhang et al.

(10) Patent No.: US 12,610,669 B2
(45) Date of Patent: Apr. 21, 2026

(54) ELECTRONIC DEVICE AND METHOD FOR MANUFACTURING THE SAME

(71) Applicant: InnoLux Corporation, Miao-Li County (TW)

(72) Inventors: Zhi-Wei Zhang, Miao-Li County (TW); Hua-Pin Chen, Miao-Li County (TW); Shuai Wang, Miao-Li County (TW); Chien-Hao Kuo, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 373 days.

(21) Appl. No.: 18/317,567

(22) Filed: May 15, 2023

(65) Prior Publication Data

US 2023/0411570 A1    Dec. 21, 2023

(30) Foreign Application Priority Data

Jun. 15, 2022    (CN) .......................... 202210679379.8

(51) Int. Cl.
| | |
|---|---|
| *H10H 20/852* | (2025.01) |
| *H10H 20/856* | (2025.01) |
| *H10K 50/844* | (2023.01) |
| *H10K 50/856* | (2023.01) |
| *H01L 25/075* | (2006.01) |
| *H10H 20/01* | (2025.01) |
| *H10K 59/80* | (2023.01) |

(52) U.S. Cl.
CPC ........ *H10H 20/852* (2025.01); *H10H 20/856* (2025.01); *H10K 50/844* (2023.02); *H10K 50/856* (2023.02); *H01L 25/0753* (2013.01);

*H10H 20/0362* (2025.01); *H10K 59/873* (2023.02); *H10K 59/878* (2023.02)

(58) Field of Classification Search
CPC .............. H10H 20/852; H10H 20/856; H10H 20/0362; H10K 50/856; H10K 50/844; H10K 59/873; H10K 59/878; H01L 25/0753
USPC ......................................................... 257/787
See application file for complete search history.

(56) References Cited

U.S. PATENT DOCUMENTS

| | | | |
|---|---|---|---|
| 10,761,373 B2 | 9/2020 | Liao et al. | |
| 2013/0092973 A1* | 4/2013 | Kondo ................. | H10H 20/854 |
| | | | 524/500 |

FOREIGN PATENT DOCUMENTS

| | | | |
|---|---|---|---|
| CN | 112652692 | * | 4/2021 |
| EP | 3489572 A | | 5/2019 |
| TW | 202144471 A | | 12/2021 |

* cited by examiner

*Primary Examiner* — Tu-Tu V Ho
(74) *Attorney, Agent, or Firm* — MUNCY, GEISSLER, OLDS & LOWE, P.C.

(57) ABSTRACT

An electronic device and a method for manufacturing the same are provided. The electronic device includes: a substrate; an electronic component disposed on the substrate; a first optical component disposed on the substrate and the electronic component; and a first optical adhesive disposed between the substrate and the first optical component to bond the substrate and the first optical component, wherein a Young's modulus of the first optical adhesive ranges between 10 kPa and 150 kPa.

18 Claims, 8 Drawing Sheets

ELECTRONIC DEVICE AND METHOD FOR MANUFACTURING THE SAME

CROSS-REFERENCE TO RELATED APPLICATIONS

This application claims the benefits of the Chinese Patent Application Serial Number 202210679379.8, filed on Jun. 15, 2022, the subject matter of which is incorporated herein by reference.

BACKGROUND

Field

The present disclosure provides an electronic device and a method for manufacturing the same. More specifically, the present disclosure provides an electronic device comprising an optical adhesive.

Description of Related Art

Electronic devices containing electronic components have been used in products in various fields. In the existing manufacturing process, the protective adhesive for the electronic components has to be cured at high temperature, which may easily cause yellowing of the electronic device, decrease in reflectivity of the units in the electronic components, or warp, etc., which will affect the quality. Alternatively, high temperature curing takes longer time, resulting in increased costs.

Therefore, it is desirable to provide an electronic device and a method for manufacturing the same to improve the shortcomings of existing technologies.

SUMMARY

The present disclosure provides an electronic device, comprising: a substrate; an electronic component disposed on the substrate; a first optical component disposed on the substrate and the electronic component; and a first optical adhesive disposed between the substrate and the first optical component to bond the substrate and the first optical component, wherein a Young's modulus of the first optical adhesive ranges between 10 kPa and 150 kPa.

The present disclosure also provides a method for manufacturing an electronic device, comprising the following steps: providing a substrate; disposing an electronic component on the substrate; and adhering a first optical adhesive on the substrate and the electronic component and performing a vacuuming step, wherein a temperature of the vacuuming step ranges between 10° C. and 70° C.

The present disclosure further provides an electronic device, comprising: a substrate; an electronic component disposed on the substrate; a reflective structure disposed on the substrate and adjacent to the electronic component; a first optical component disposed on the substrate and the electronic component; and a first optical adhesive disposed between the substrate and the first optical component to bond the substrate and the first optical component, wherein there is a gap between the reflective structure and the electronic component, and the gap ranges between 0.05 mm and 0.25 mm.

Other novel features of the disclosure will become more apparent from the following detailed description when taken in conjunction with the accompanying drawings.

DETAILED DESCRIPTION

Figure 1:
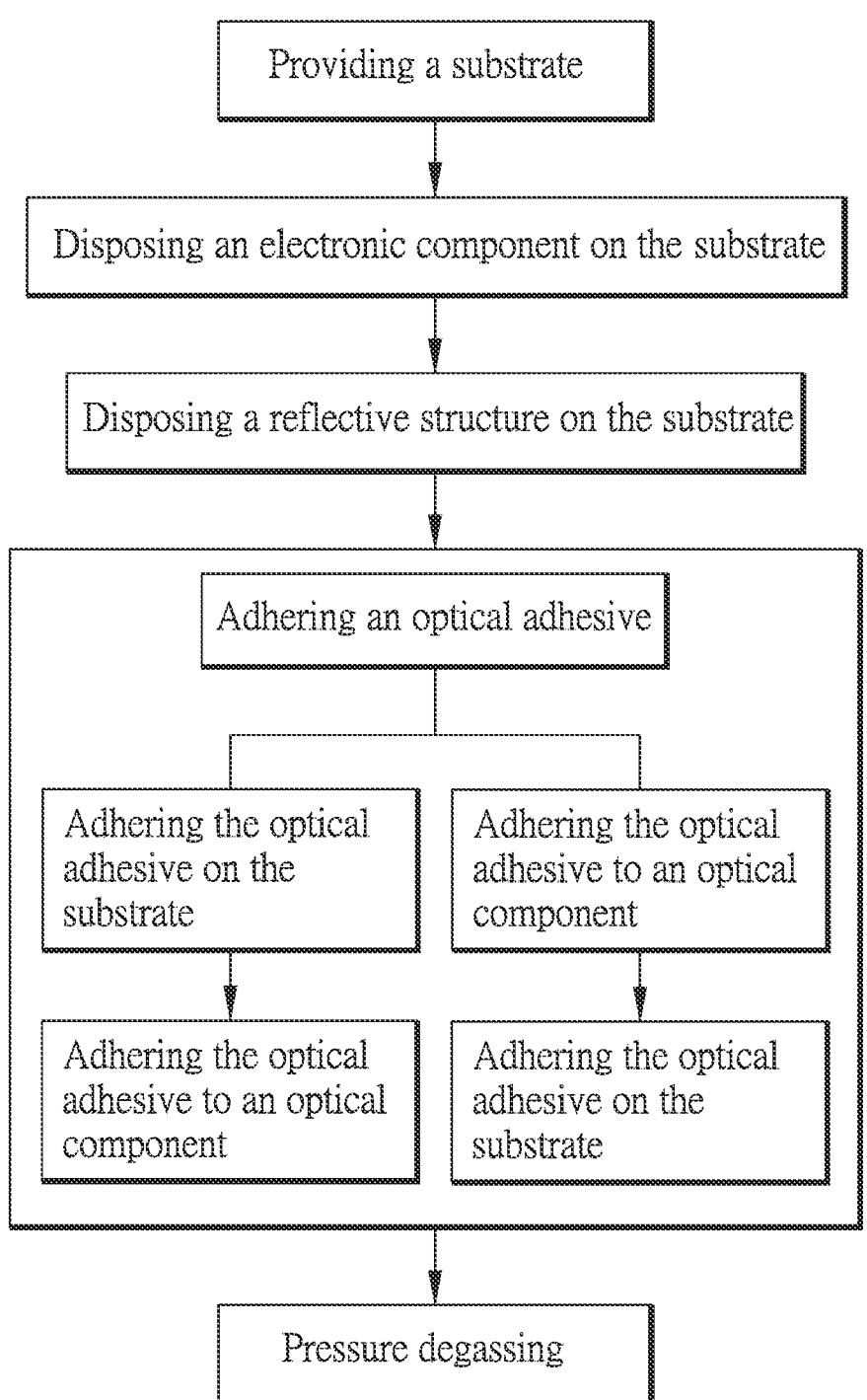
FIG. 1 is a block diagram showing a method for manufacturing an electronic device according to one embodiment of the present disclosure.

Reference will now be made in detail to exemplary embodiments of the present disclosure, examples of which are illustrated in the accompanying drawings. Wherever possible, the same reference numerals are used in the drawings and description to refer to the same or like parts.

Throughout the specification and the appended claims, certain terms may be used to refer to specific components. Those skilled in the art will understand that electronic device manufacturers may refer to the same components by different names. The present disclosure does not intend to distinguish between components that have the same function but have different names. In the following description and claims, terms such as "containing" and "comprising" are open-ended terms, and should be interpreted as meaning "including but not limited to . . . "

Directional terms mentioned in the specification, such as "up", "down", "front", "rear", "left", "right", etc., only refer to the directions of the drawings. Accordingly, the directional term used is for the purpose of illustration, not limitation, of the present disclosure. In the drawings, various figures illustrate the general characteristics of methods, structures and/or materials used in particular embodiments. However, these drawings should not be construed to define or limit the scope or nature encompassed by these embodiments. For example, the relative sizes, thicknesses and positions of various layers, regions and/or structures may be reduced or enlarged for clarity.

One structure (or layer, component, substrate) described in the present disclosure is disposed on/above another structure (or layer, component, substrate), which can mean that the two structures are adjacent and directly connected, or can refer to two structures that are adjacent rather than directly connected. Indirect connection means that there is at least one intermediate structure (or intermediate layer, intermediate component, intermediate substrate, intermediate space) between the two structures, the lower surface of one structure is adjacent to or directly connected to the upper surface of the intermediate structure, and the upper surface of the other structure is adjacent to or directly connected to the lower surface of the intermediate structure. The intermediate structure may be a single-layer or multi-layer physical structure or a non-physical structure, which is not limited. In the present disclosure, when a certain structure is arranged "on" other structures, it may mean that a certain structure is "directly" on other structures, or it means that a certain structure is "indirectly" on other structures; that is, at least one structure is sandwiched, in between a certain structure and other structures.

The terms, such as "about", "equal to", "equal" or "same", "substantially", or "approximately", are generally interpreted as within 20% of a given value or range, or as within 10%, 5%, 3%, 2%, 1%, or 0.5% of a given value or range.

Furthermore, any two values or directions used for comparison may have certain errors. If the first value is equal to the second value, it implies that there may be an error of about 10% between the first value and the second value. If the first direction is perpendicular or "substantially" perpendicular to the second direction, the angle between the first direction and the second direction may range between 80 degrees and 100 degrees. If the first direction is parallel or "substantially" parallel to the second direction, the angle between the first direction and the second direction may range between 0 degree and 10 degrees.

In the specification and claims, unless otherwise specified, ordinal numbers, such as "first", "second", etc., used herein are intended to modify elements, which do not imply and represent that the (or these) elements have any previous ordinal numbers, nor does not imply an order of one element over another, or an order in manufacturing methods. These ordinal numbers are used only to clearly distinguish an element with a certain designation from another element with the same designation. The claims and the description may not use the same term, accordingly, the first component in the description may be the second component in the claim.

In the present disclosure, the Young's modulus can be measured by a Young's modulus tester or a tensile testing machine or other suitable instruments or methods, but is not limited thereto. In addition, the terms "the given range is from the first value and the second value" and "the given range falls within the range from the first value to the second value" mean that the given range includes the first value, the second value and other values therebetween.

In addition, the electronic device disclosed in the present disclosure may include a display device, a backlight device, an antenna device, a sensing device, a tiled device, a touch display, a curved display or a free shape display, but is not limited thereto. The electronic device may include, for example, liquid crystals, light emitting diodes, fluorescence, phosphors, other suitable display media, or a combination thereof, but is not limited thereto. The display device may be a non-self-luminous display device or a self-luminous display device. The antenna device may be a liquid crystal type antenna device or a non-liquid crystal type antenna device. The sensing device may be a sensing device that senses capacitance, light, heat or ultrasonic waves. However, the present disclosure is not limited thereto. Electronic components may include passive components and active components, such as capacitors, resistors, inductors, diodes, transistors, and the like. The diode may include a light emitting diode (LED) or a photodiode. The light emitting diode may include, for example, an organic light emitting diode (OLED), a mini LED, a micro LED or a quantum dot LED, but is not limited thereto. The tiled device may include, for example, a tiled display device or a tiled antenna device, but is not limited thereto. It should be noted that the electronic device can be any arrangement and combination of the aforementioned components or devices, but the present disclosure is not limited thereto. In addition, the electronic device may be a bendable or flexible electronic device. It should be noted that the electronic device can be any arrangement and combination of the aforementioned components or devices, but the present disclosure is not limited thereto. In addition, the shape of the electronic device can be rectangular, circular, polygonal, with curved edges, or other suitable shapes. The electronic device may have peripheral systems such as a drive system, a control system, a light source system, a shelf system, etc. to support a display device, an antenna device or a tiled device. For the convenience of description, the backlight device is used as the electronic device for description below, but the present disclosure is not limited thereto.

It should be understood that, according to the embodiments of the present disclosure, an optical microscope (OM), a scanning electron microscope (SEM), a film thickness profilometer ($\alpha$-step), an ellipsometer, or other suitable ways may be used to measure the depth, thickness, width or height of each element, or the gap or distance between elements. According to some embodiments, a scanning electron microscope may be used to obtain a cross-sectional structure image including the elements to be measured, and the depth, thickness, width or height of each element, or the gap or distance between elements can be measured.

It should be noted that in the following embodiments, without departing from the spirit of the present disclosure, features in several different embodiments may be replaced, reorganized, or mixed to complete other embodiments. As long as the features of the various embodiments do not violate the spirit of the present disclosure or conflict, they can be mixed and matched arbitrarily.

Unless otherwise defined, all terms (including technical and scientific terms) used herein have the same meaning as commonly understood by one of ordinary skill in the art. It should be understood that these terms, such as those defined in commonly used dictionaries, should be interpreted as having meanings consistent with the background or context of the related technology and the present disclosure, and should not be interpreted in an idealized or overly formal manner, unless otherwise specified in the embodiments of the present disclosure.

Figure 2A:
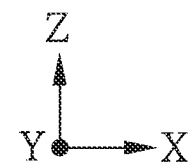
FIG. 2A to FIG. 2C are cross-sectional views of a part of an electronic device according to one embodiment of the present disclosure.
Figure 2A:
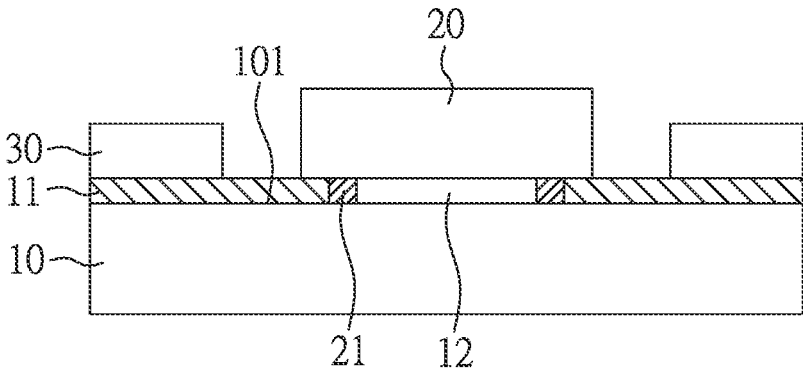
Figure 2B:
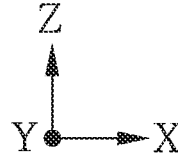
Figure 2B:
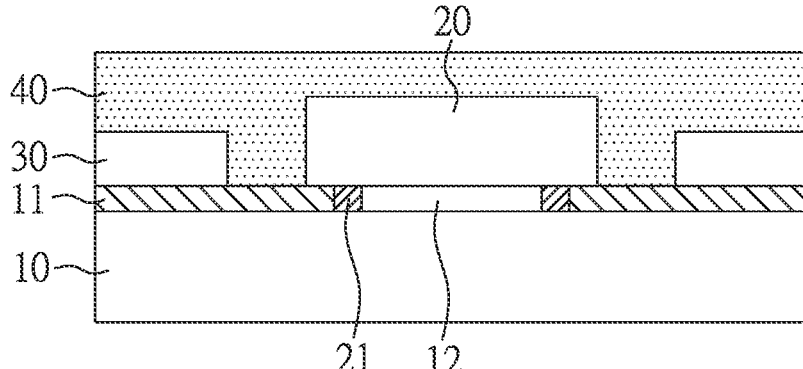
Figure 2C:
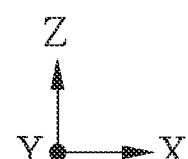
Figure 2C:
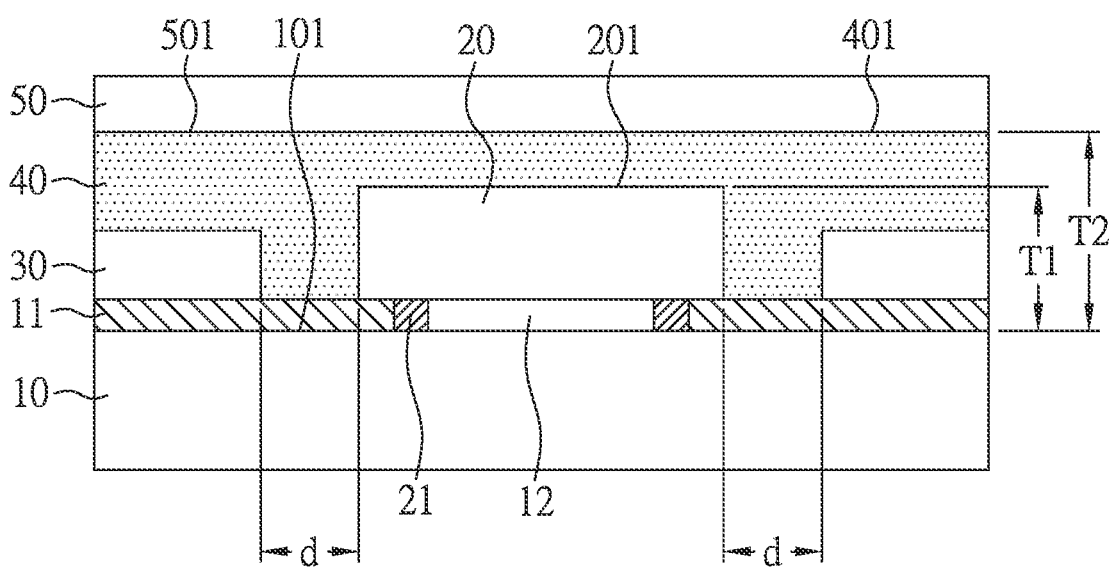

FIG. 1 is a block diagram showing a method for manufacturing an electronic device according to one embodiment of the present disclosure. FIG. 2A to FIG. 2C are cross-sectional views of a part of an electronic device according to one embodiment of the present disclosure.

As shown in FIG. 1 and FIG. 2A, a substrate 10 is provided. The material of the substrate 10 may include quartz, glass, silicon wafer, sapphire, polycarbonate (PC), polyimide (PI), polypropylene (PP), polyethylene terephthalate (PET), or other plastic or polymer materials, or a combination thereof, but is not limited thereto. As shown in FIG. 2A, a reflective layer 11 may be disposed on a first surface 101 of the substrate 10, and the reflective layer 11 may include a metal, white ink, other reflective materials or a combination thereof. The metal may include, but is not limited to, gold, silver, copper, aluminum, other suitable materials, or a combination thereof. The white ink may comprise white polyimide, resin, other suitable materials or a combination thereof, but is not limited thereto. The reflective layer 11 may be disposed on the first surface 101 of the substrate 10 by any suitable method, and suitable methods may include sputtering, electroplating, chemical plating, chemical vapor deposition, dip coating, spin coating, roller coating, blade coating, spraying, other methods or a combination thereof, but not limited thereto.

Next, an electronic component 20 is disposed on the substrate 10, and a reflective structure 30 is disposed on the substrate 10 and adjacent to the electronic component 20. In the present disclosure, the electronic component 20 may include a light emitting diode, but is not limited thereto. The light emitting diode may include, an OLED, a LED, a mini-LED, a micro-LED, a QLED or a QD-LED, but is not limited thereto. In addition, as shown in FIG. 2A, the electronic component 20 may include a plurality of pins 21, and the electronic component 20 may be electrically connected to a circuit (not shown) or a component (not shown) formed on the substrate 10 through the pins 21. The material of the pins 21 may include gold, silver, copper, aluminum, titanium, chromium, nickel, molybdenum, an alloy thereof, or a combination thereof, but is not limited thereto. In the present disclosure, the reflective structure 30 may comprise a white reflective layer, a metal reflective layer, an enhanced specular reflector or a combination thereof. The white reflective layer may comprise, titanium dioxide ($TiO_2$), white polyimide, resin, other suitable materials, or a combination thereof, but is not limited thereto. The metal reflective layer may include gold, silver, copper, aluminum, other suitable materials or a combination thereof, but is not limited thereto. In one embodiment, there may be air 12 between the pins 21 of the electronic component 20, but the present disclosure is not limited thereto.

Next, a first optical adhesive 40 is adhered on the substrate 10 and the electronic component 20 and a vacuuming step is performed to bond the substrate 10 and a first optical component 50. As shown in FIG. 2B and FIG. 2C, the first optical adhesive 40 is firstly adhered on the substrate 10 and the electronic component 20, and the first optical component 50 is disposed on a side of the first optical adhesive 40 away from the substrate 10 to bond the substrate 10 and the first optical component 50; but the present disclosure is not limited thereto. Alternatively, even not shown in the figure, the first optical adhesive 40 may be firstly adhered to the first optical component 50, and then a side of the first optical adhesive 40 away from the first optical component 50 is adhered on the substrate 10 and the electronic component 20 to bond the substrate 10 and the first optical component 50. In some embodiments, before the step of adhering the optical adhesive on the substrate 10 and the electronic component 20, the process may further comprise a step of adhering the optical adhesive to an optical component. In some embodiments, the vacuuming step may reduce the generation of air bubbles between the first optical adhesive 40 and the first optical component 50, which can improve the bonding effect. Alternatively, the vacuuming step may reduce the generation of air bubbles between the first optical adhesive 40 and the substrate 10, which can improve the bonding effect. In the present disclosure, the temperature of the vacuuming step may range between 10° C. and 70° C., between 10° C. and 50° C. or between 10° C. and 30° C., but is not limited thereto. In the present disclosure, the first optical component 50 may include a transparent base (such as polyethylene terephthalate or other suitable materials), an optical film, or a combination thereof, but is not limited thereto. The optical film may include a brightness enhancement film, a diffusion film, other suitable light source sheets or a combination thereof, but is not limited thereto. In the present disclosure, the first optical adhesive may include optically clear adhesive (OCA), other suitable materials or a combination thereof, but is not limited thereto. In the present disclosure, the first optical adhesive 40 can provide double-sided adhesive effect to bond the substrate 10 and the first optical component 50. In the present disclosure, the first optical adhesive 40 has the characteristics of low temperature rework or no high temperature curing, which can improve the defect rate or shorten the process time, etc.

In addition, since the first optical component 50 can be bonded to the substrate 10 through the first optical adhesive 40, the assembly tolerance can be reduced and the process yield can be improved.

Next, a pressure degassing step may be performed to further remove air bubbles in the material of the first optical adhesive 40 to improve the bonding effect of the first optical adhesive 40. In the present disclosure, the pressure of the pressure degassing step may range from 1 kgf to 10 kgf, for example, may range from 3 kgf to 8 kgf or from 4 kgf to 7 kgf, but is not limited thereto. The temperature of the pressure degassing step may range from 10° C. to 70° C., for example, may range from 30° C. to 70° C., 35° C. to 65° C. or 40° C. to 60° C., but is not limited thereto.

The method for manufacturing an electronic device of the present disclosure may comprise the following steps: providing a substrate 10; disposing an electronic component 20 on the substrate 10; and adhering an optical adhesive 40 on the substrate 10 and the electronic component 20 and performing a vacuuming step, wherein a temperature of the vacuuming step ranges between 10° C. and 70° C.

The electronic device prepared by the above steps can be shown in FIG. 2C. The electronic device may comprise: a substrate 10; an electronic component 20 disposed on the substrate 10; a first optical component 50 disposed on the substrate 10 and the electronic component 20; and a first optical adhesive 40 disposed between the substrate 10 and the first optical component 50 to bond the substrate 10 and the first optical component 50.

In some embodiments, a Young's modulus of the first optical adhesive 40 ranges between 10 kPa and 150 kPa, but is not limited thereto. In some embodiments, the Young's modulus of the first optical adhesive 40 ranges between 30 kPa and 130 kPa, between 50 kPa and 110 kPa or between 60 kPa and 100 kPa. When the Young's modulus of the first optical adhesive 40 is within the above range, it is beneficial for the first optical adhesive 40 to be reworked at low temperature, and the defect rate of electronic devices can be improved. Materials with high Young's modulus are difficult to effectively rework.

In some embodiments, the electronic device may further comprise a reflective structure 30 disposed on the substrate 10 and adjacent to the electronic component 20, wherein there is a gap d between the reflective structure 30 and the electronic component 20, and the gap d ranges between 0.05 mm and 0.25 mm. However, the present disclosure is not limited thereto. In some embodiment, the gap d ranges between 0.08 mm and 0.22 mm. In some embodiment, the gap d ranges between 0.1 mm and 0.2 mm. When the gap d is too large, the reflection effect of the reflective structure 30 will decrease. When the gap d is too small, air or gaps are likely to exist between the first optical adhesive 40 and the substrate 10, thereby affecting the bonding effect of the first optical adhesive 40. Therefore, when the gap d is designed within the above-mentioned range, both the adhesive effect and the reflective effect can be achieved and a balance effect can be accomplished.

In the present disclosure, as shown in FIG. 2C, the substrate 10 has a first surface 101, the electronic component 20 has a second surface 201 away from the first surface 101, and the first optical component 50 has a third surface 501 adjacent to the first surface 101. There is a first distance T1 between the second surface 201 of the electronic component 20 and the first surface 101 of the substrate 10, there is a second distance T2 between the third surface 501 of the first optical component 50 and the first surface 101 of the substrate 10, and the first distance T1 and the second distance T2 satisfy the following equation:

$$T1 \times 1.5 < T2 \leq 3 \text{ mm}$$

wherein T1 is the first distance and T2 is the second distance.

The aforesaid first distance T1 is, for example, the maximum distance between the second surface 201 of the electronic component 20 and the first surface 101 of the substrate 10 in the normal direction Z of the substrate 100 measured at a cross-section. The aforesaid second distance T2 is, for example, the maximum distance between the third surface 501 of the first optical component 50 and the first surface 101 of the substrate 10 in the normal direction Z of the substrate 100 measured at the cross-section. When the second distance T2 is too small, the protective effect of the first optical adhesive 40 on the electronic component 20 will be reduced. When the second distance T2 is too large, the thickness of the electronic device is relatively large, which may affect the optical effect or result in a thinner design that cannot be realized. When the first distance T1 and the second distance T2 conform to the above relationship, a balance between the protection effect and the optical effect or thinning design can be achieved. In some embodiments, the first distance T1 may range from 100 µm to 150 µm, for example, from 100 µm to 120 µm or from 105 µm to 115 µm, but is not limited thereto. In some embodiments, the second distance T2 may range from 150 µm to 300 µm, for example, from 180 µm to 270 µm or from 200 µm to 250 µm, but is not limited thereto. In addition, in some embodiments, the second distance T2 may be substantially equal to the distance between the upper surface 401 of the first optical adhesive 40 and the first surface 101 of the substrate 10.

As shown in FIG. 2C, the first distance T1 may be greater than a thickness of the reflective structure 30. When the electronic component 20 is a light emitting component, the light emitted by the electronic component 20 can be reflected by the reflective structure 30, which can improve the reflective effect of the reflective structure 30. In the present disclosure, the thickness of the reflective structure 30 may range from 50 µm to 80 µm, for example, from 55 µm to 75 µm or from 60 µm to 70 µm, but is not limited thereto. The light emitting component may include, for example, an OLED, a mini-LED, a micro-LED, a QLED or a QD-LED, but is not limited thereto.

Figure 3:
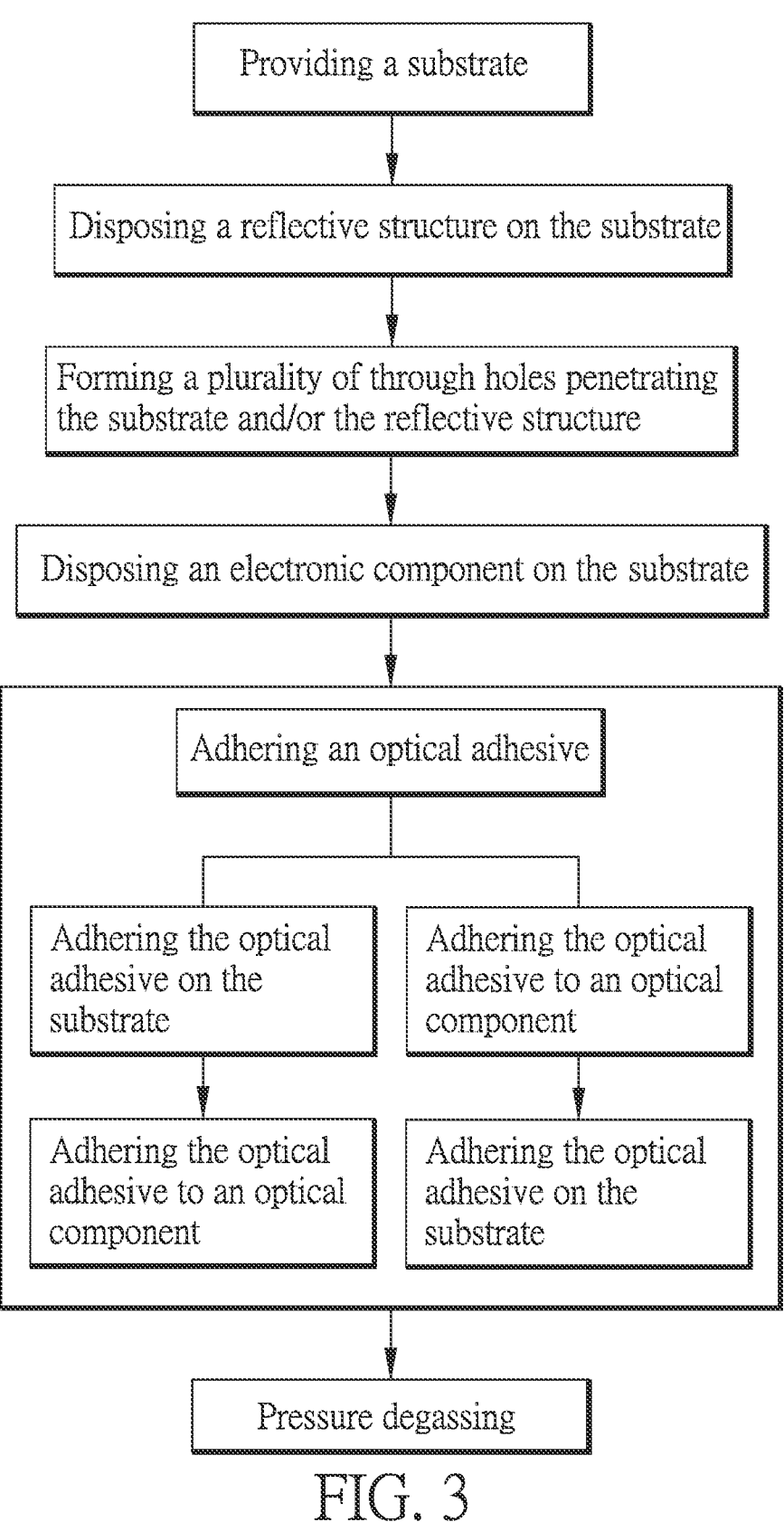
FIG. 3 is a block diagram showing a method for manufacturing an electronic device according to one embodiment of the present disclosure.

FIG. 3 is a block diagram showing a method for manufacturing an electronic device according to one embodiment of the present disclosure. FIG. 4A to FIG. 4D are cross-sectional views of a part of an electronic device according to one embodiment of the present disclosure.

Figure 4A:
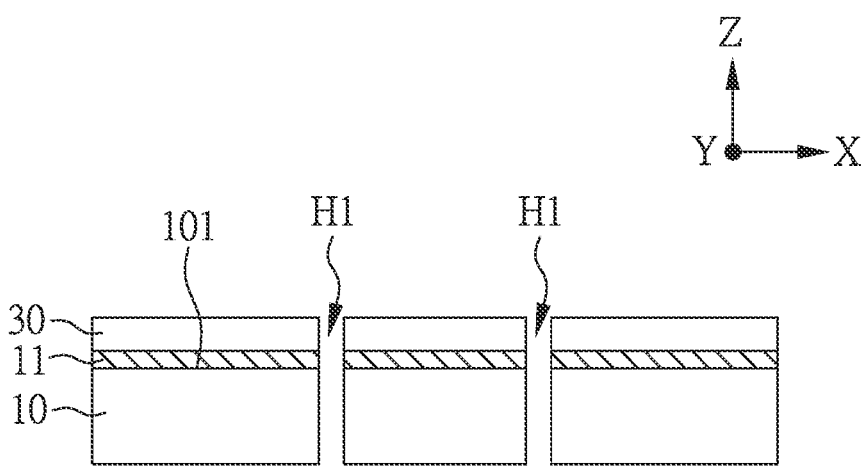
FIG. 4A to FIG. 4D are cross-sectional views of a part of an electronic device according to one embodiment of the present disclosure.

As shown in FIG. 3 and FIG. 4A, a substrate 10 is firstly provided. A reflective layer 11 is disposed on the substrate 10 (for example, on the first surface 101). A reflective structure 30 is disposed on the substrate 10. Then, a plurality of through holes H1 penetrating the substrate 10 and/or the reflective structure 30 are formed. For example, the plurality of through holes H1 penetrating the substrate 10 and/or the reflective structure 30 may be formed by laser. The material of the substrate 10, the material and manufacturing method of the reflective layer 11 and the material of the reflective structure 30 are similar to those described above, and are not repeated here.

Figure 4B:
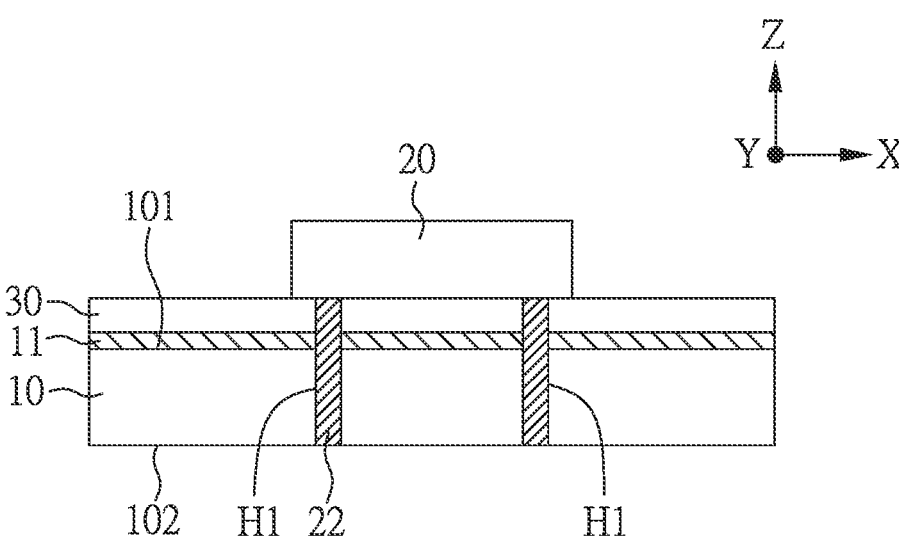

Next, as shown in FIG. 4B, a conductive material 22 is formed in the plurality of through holes H1 respectively. Then, an electronic component 20 is disposed on the substrate 10, and the electronic component 20 may correspond to the through holes H1. Alternatively, the electronic component 20 may overlap the through holes H1 in the normal direction Z of the substrate 10. In the present disclosure, the electronic component 20 may electrically connected to the circuits (not shown, for example, formed on the surface 102) or the components (not shown, for example, formed on the surface 102) formed on the substrate 10 (for example, on the surface 102 of the substrate opposite to the first surface 101) through the conductive material 22. In the present disclosure, the conductive material 22 may include gold, silver, copper, aluminum, titanium, chromium, nickel, molybdenum, other suitable materials, an alloy thereof, or a combination thereof, but is not limited thereto.

Figures 4C, 4D:
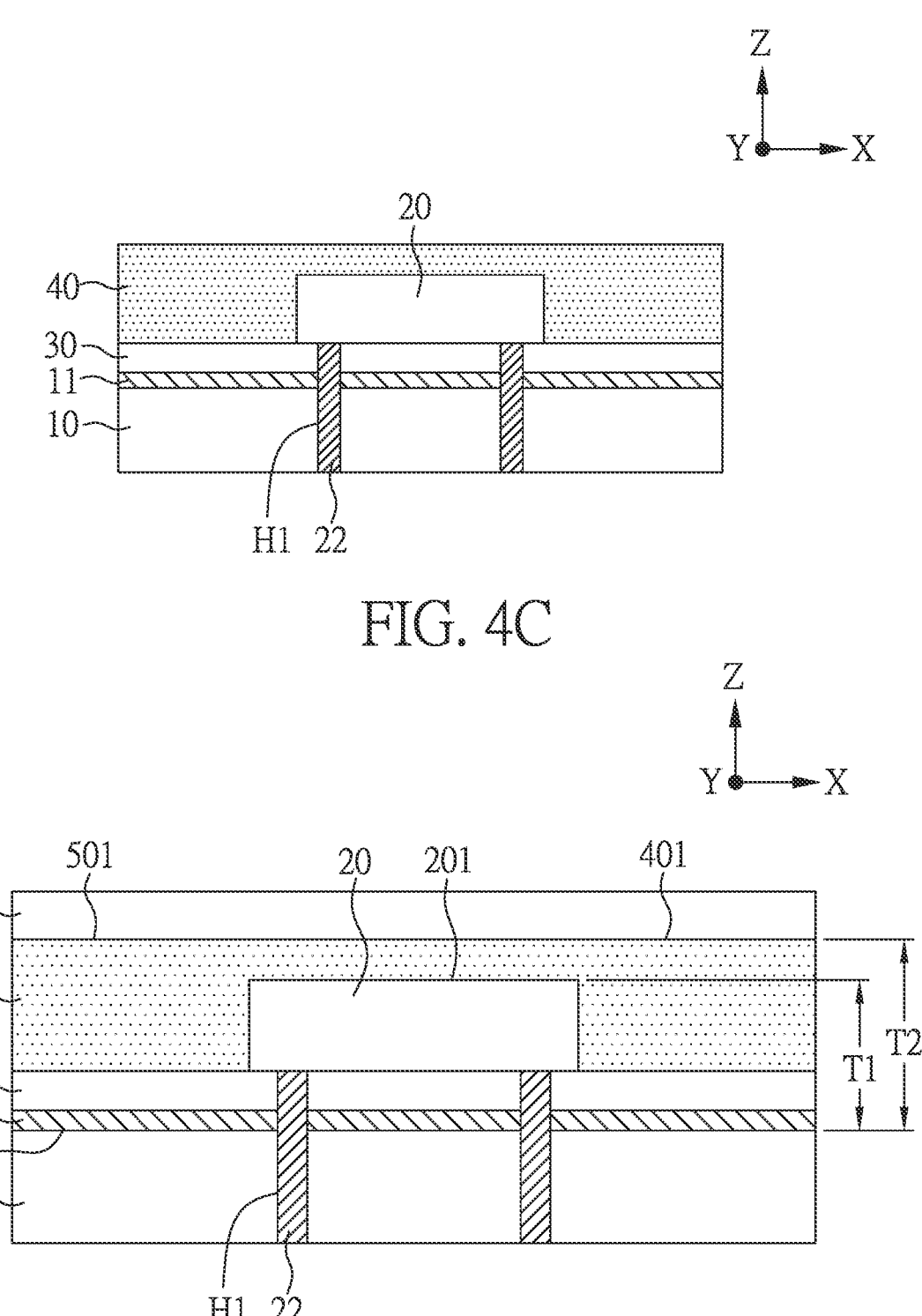

Next, a first optical adhesive 40 is adhered on the substrate 10 and the electronic component 20, and a vacuuming step is performed to bond the substrate 10 and a first optical component 50. As shown in FIG. 4C and FIG. 4D, the first optical adhesive 40 is firstly adhered on the substrate 10 and the electronic component 20, and the first optical component 50 is disposed on a side of the first optical adhesive 40 away from the substrate 10 to bond the substrate 10 and the first optical component 50. Alternatively, even not shown in the figure, before the step of adhering the first optical adhesive 40 on the substrate 10 and the electronic component 20, the process may further comprise a step of adhering the first optical adhesive 40 to the first optical component 50. More specifically, the first optical adhesive 40 is firstly adhered to the first optical component 50, and then a side of the first optical adhesive 40 away from the first optical component 50 is adhered to the substrate 10 and the electronic component 20 to bond the substrate 10 and the first optical component 50. Herein, the first optical component 50, the first optical adhesive 40 and the vacuuming step are similar to those described above, and are not repeated here. Since the first optical adhesive 40 has the characteristics of low-temperature rework or no high-temperature curing, as mentioned above, the yellowing or warping of the electronic device of the present disclosure can be reduced, the defect rate can be improved, or the process time can be shorten.

Next, a pressure degassing step may be performed to improve the bonding effect of the first optical adhesive 40. In the present disclosure, the conditions for the pressure degassing step are similar to those described above, and are not repeated here.

The electronic device prepared by the above steps can be shown in FIG. 4D. The electronic device of FIG. 4D is similar to that of FIG. 2C except for the following differences.

As shown in FIG. 4D, in the present embodiment, the plurality of through holes H1 penetrating the substrate 10 and/or the reflective structure 30 are formed. The electronic component 20 is disposed correspondingly to the through holes H1, or the electronic component 20 may overlap the through holes H1 in the normal direction Z of the substrate 10. In addition, the electronic device further comprises the conductive material 22 disposed or filled in the through holes H1. The electronic component 20 may be electrically connected to the circuits (not shown, for example, formed on the surface 102 as shown in FIG. 4B) or the components (not shown, for example, formed on the surface 102 as shown in FIG. 4B) formed on the substrate 10 (for example, on the surface 102 of the substrate opposite to the first surface 101 as shown in FIG. 4B) through, for example, the conductive material 22.

In the present embodiment, there is a first distance T1 between the second surface 201 of the electronic component 20 and the first surface 101 of the substrate 10, there is a second distance T2 between the third surface 501 of the first optical component 50 and the first surface 101 of the substrate 10, and the first distance T1 and the second distance T2 satisfy the following equation:

$$T1 \times 1.5 < T2 \leq 3 \text{ mm}$$

wherein T1 is the first distance and T2 is the second distance.

The definitions of the first distance T1 and the second distance T2 can refer to the above description related to FIG. 2C. Similar to FIG. 2C, when the first distance T1 and the second distance T2 conform to the above relationship, as described above, the balance between the protection effect and the optical effect or thinning design can be achieved. In some embodiments, the first distance T1 may range from 100 μm to 150 μm, for example, from 110 μm to 140 μm or from 120 μm to 130 μm, but is not limited thereto. In some embodiments, the second distance T2 may range from 150 μm to 300 μm, for example, from 170 μm to 280 μm or from 200 μm to 250 μm, but is not limited thereto. In addition, in some embodiments, the second distance T2 may substantially be the distance between the upper surface 401 of the first optical adhesive 40 and the first surface 101 of the substrate 10.

Figure 5:
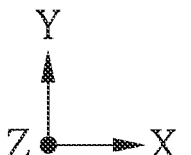
FIG. 5 is a top view of a part of an electronic device according to one embodiment of the present disclosure.
Figure 5:
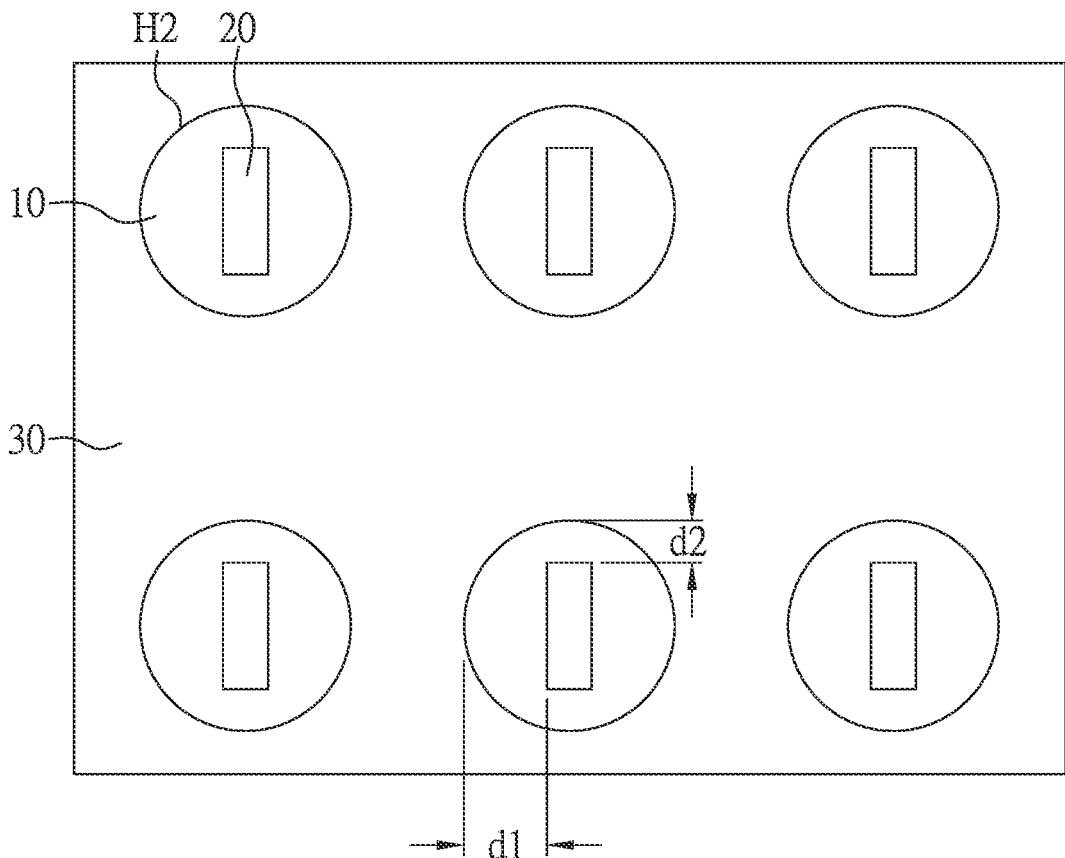

FIG. 5 is a top view of a part of an electronic device according to one embodiment of the present disclosure. For the convenience of description, some elements, such as the first optical component and the first optical adhesive, are not shown in FIG. 5.

As shown in FIG. 5, the reflective structure 30 may have a plurality of openings H2, and the electronic components 20 may be, for example, respectively disposed correspondingly to one of the plurality of openings H2, but the present disclosure is not limited thereto. In the normal direction Z of the substrate 10, the openings H2 may respectively expose, for example, a part of the substrate 10. In the normal direction Z of the substrate 10, there may be a first gap d1 and/or a second gap d2 between the reflective structure 30 and the electronic component 20, and the first gap d1 and/or the second gap d2 may respectively range between 0.05 mm and 0.25 mm. However, the present disclosure is not limited thereto. In some embodiments, the first gap d1 and/or the second gap d2 may respectively range between 0.1 mm and 0.2 mm. In some embodiments, the first gap d1 may not be equal to the second gap d2, but is not limited thereto. In some other embodiments, the first gap d1 may be substantially equal to the second gap d2. When the first gap d1 and the second gap d2 are designed within the above range, a balance between the adhesion effect and the reflection effect can be accomplished.

Figure 6:
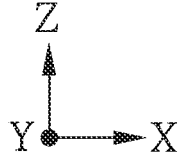
FIG. 6 is a cross-sectional view of a part of an electronic device according to one embodiment of the present disclosure.
Figure 6:
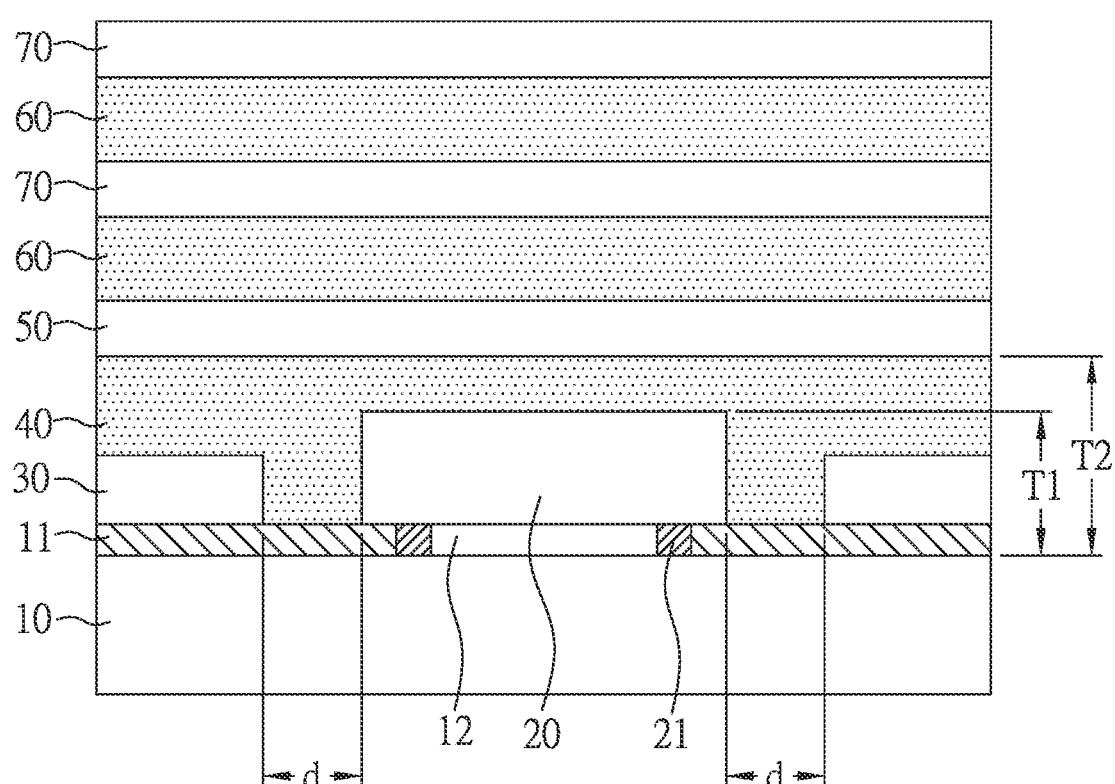

FIG. 6 is a cross-sectional view of a part of an electronic device according to one embodiment of the present disclosure. The electronic device of FIG. 6 is similar to that of FIG. 2C except for the following differences.

As shown in FIG. 6, the electronic device of the present disclosure may further comprise a second optical component 70 and/or a second optical adhesive 60, wherein the second optical component 70 and/or the second optical adhesive 60 may be respectively disposed on the first optical component 50, and the second optical adhesive 60 may be disposed between the first optical component 50 and the second optical component 70. The second optical component 70 may be bonded to the first optical component 50 by the second optical adhesive 60, so the assembly tolerance between the second optical component 70 and the first optical component 50 can be reduced and the process yield or optical efficiency can be improved.

Herein, the second optical component 70 and the first optical component 50 may be the same type or different types of optical components, and the same type above means optical components with similar functions. In some embodiments, the materials of the second optical adhesive 60 and the first optical adhesive 40 may be similar, and are not repeated here. In addition, the first optical component 50 and the second optical component 70 may be the same or different, and the second optical adhesive 60 and the first optical adhesive 40 may be the same or different.

In the present disclosure, the electronic device may further comprise a display panel disposed on the substrate to form a display device. Thus, the electronic device can be applied to any electronic device that requires a display panel, such as monitors, mobile phones, notebook computers, cameras, still cameras, music players, mobile navigators, TV sets and other electronic devices that display images. In addition, when the electronic device is a tiled display system, the electronic device can be applied to any electronic device that needs to display large images, such as a video wall or a billboard.

The above specific examples should be construed as merely illustrative and not restrictive of the remainder of the present disclosure in any way.

The invention claimed is:

1. An electronic device, comprising:
   a substrate having a first surface;
   an electronic component disposed on the substrate and having a second surface away from the first surface;
   a first optical component disposed on the substrate and the electronic component and having a third surface adjacent to the first surface; and
   a first optical adhesive disposed between the substrate and the first optical component to bond the substrate and the first optical component,
   wherein a Young's modulus of the first optical adhesive ranges between 10 kPa and 150 kPa,
   wherein there is a first distance between the second surface of the electronic component and the first surface of the substrate, there is a second distance between the third surface of the first optical component and the first surface of the substrate, and the first distance and the second distance satisfy the following equation:

$$T1 \times 1.5 < T2 \leq 3 \text{ mm, and}$$

wherein T1 is the first distance and T2 is the second distance.

2. The electronic device of claim 1, further comprising: a reflective structure disposed on the substrate and adjacent to the electronic component, wherein there is a gap between the reflective structure and the electronic component, and the gap ranges between 0.05 mm and 0.25 mm.

3. The electronic device of claim 2, wherein the reflective structure comprises a white reflective layer, a metal reflective layer, an enhanced specular reflector or a combination thereof.

4. The electronic device of claim 2, wherein the reflective structure has an opening, and the electronic component is disposed correspondingly to the opening.

5. The electronic device of claim 1, further comprising: a reflective structure disposed on the substrate, wherein the substrate and the reflective structure have a through hole penetrating the substrate and the reflective structure, and the electronic component is disposed correspondingly to the through hole.

6. The electronic device of claim 5, wherein the electronic component overlaps the through hole in a normal direction of the substrate.

7. The electronic device of claim 5, wherein a conductive material is disposed in the through hole.

8. The electronic device of claim 1, further comprising: a second optical component and a second optical adhesive, wherein the second optical component and the second optical adhesive are respectively disposed on the first optical component, and the second optical adhesive is disposed between the first optical component and the second optical component.

9. A method for manufacturing an electronic device, comprising the following steps:

providing a substrate;

disposing an electronic component on the substrate;

disposing a reflective structure on the substrate and adjacent to the electronic component; and adhering a first optical adhesive on the substrate and the electronic component and performing a vacuuming step, wherein a temperature of the vacuuming step ranges between 10° C. and 70° C.

10. The method of claim 9, further comprising a step of: adhering the first optical adhesive to an optical component before the step of adhering the first optical adhesive on the substrate and the electronic component.

11. An electronic device, comprising:

a substrate;

an electronic component disposed on the substrate;

a reflective structure disposed on the substrate and adjacent to the electronic component;

a first optical component disposed on the substrate and the electronic component; and a first optical adhesive disposed between the substrate and the first optical component to bond the substrate and the first optical component, wherein there is a gap between the reflective structure and the electronic component, and the gap ranges between 0.05 mm and 0.25 mm.

12. The electronic device of claim 11, wherein the reflective structure comprises a white reflective layer, a metal reflective layer, an enhanced specular reflector or a combination thereof.

13. The electronic device of claim 11, wherein the reflective structure has an opening, and the electronic component is disposed correspondingly to the opening.

14. The electronic device of claim 11, wherein the substrate has a first surface, the electronic component has a second surface away from the first surface, and the first optical component has a third surface adjacent to the first surface; wherein there is a first distance between the second surface of the electronic component and the first surface of the substrate, there is a second distance between the third surface of the first optical component and the first surface of the substrate, and the first distance and the second distance satisfy the following equation:

$$T1 \times 1.5 < T2 \leq 3 \text{ mm}$$

wherein T1 is the first distance and T2 is the second distance.

15. The electronic device of claim 11, wherein the substrate and the reflective structure have a through hole penetrating the substrate and the reflective structure, and the electronic component is disposed correspondingly to the through hole.

16. The electronic device of claim 15, wherein the electronic component overlaps the through hole in a normal direction of the substrate.

17. The electronic device of claim 15, wherein a conductive material is disposed in the through hole.

18. The electronic device of claim 11, further comprising: a second optical component and a second optical adhesive, wherein the second optical component and the second optical adhesive are respectively disposed on the first optical component, and the second optical adhesive is disposed between the first optical component and the second optical component.

\* \* \* \* \*